US010452794B2

(12) United States Patent
Castillo (10) Patent No.: US 10,452,794 B2
(45) Date of Patent: Oct. 22, 2019

(54) GENERATING A SCRIPT FOR PERFORMING A WELL OPERATION JOB

(71) Applicant: Homero Cesar Castillo, Humble, TX (US)

(72) Inventor: Homero Cesar Castillo, Humble, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 429 days.

(21) Appl. No.: 15/247,447

(22) Filed: Aug. 25, 2016

(65) Prior Publication Data

US 2018/0060455 A1  Mar. 1, 2018

(51) Int. Cl.
| | |
|---|---|
| *G06F 17/50* | (2006.01) |
| *E21B 47/00* | (2012.01) |
| *E21B 41/00* | (2006.01) |
| *E21B 47/04* | (2012.01) |
| *E21B 47/06* | (2012.01) |
| *E21B 47/12* | (2012.01) |
| *G01V 11/00* | (2006.01) |

(52) U.S. Cl.
CPC ...... *G06F 17/5009* (2013.01); *E21B 41/0092* (2013.01); *E21B 47/0006* (2013.01); *E21B 47/04* (2013.01); *E21B 47/06* (2013.01); *E21B 47/12* (2013.01); *G01V 11/00* (2013.01)

(58) Field of Classification Search
None
See application file for complete search history.

(56) References Cited

U.S. PATENT DOCUMENTS

| | | | | |
|---|---|---|---|---|
| 4,380,806 A | * | 4/1983 | Waters | G01V 1/375 367/27 |
| 5,753,813 A | * | 5/1998 | Hagiwara | E21B 47/09 166/254.2 |
| 2005/0126777 A1 | * | 6/2005 | Rolovic | E21B 47/10 166/255.1 |
| 2006/0113110 A1 | | 6/2006 | Leuchtenberg | |
| 2007/0271077 A1 | * | 11/2007 | Kosmala | E21B 43/00 703/5 |
| 2010/0193245 A1 | | 8/2010 | Glomsrud et al. | |
| 2012/0173218 A1 | | 7/2012 | Shafer et al. | |
| 2012/0296619 A1 | * | 11/2012 | Maliassov | E21B 43/00 703/10 |

(Continued)

OTHER PUBLICATIONS

Notification of Transmittal of the International Search Report and the Written Opinion of the International Searching Authority, or the Declaration; PCT/US2017/047956; dated Aug. 22, 2017; 12 pages.

*Primary Examiner* — Kibrom K Gebresilassie
(74) *Attorney, Agent, or Firm* — Cantor Colburn LLP (57) ABSTRACT

Examples of techniques for deployment risk management are disclosed. In one example implementation according to aspects of the present disclosure, a computer-implemented method may include: receiving, by a processing device, operating parameters for simulating a well operation job; simulating, by the processing device, the well operation job based on the operating parameters to generate a script for performing the well operation job, wherein the script comprises an ordered plurality of tasks and corresponding task parameters; and performing the well operation job based on the script generated by the simulation.

18 Claims, 7 Drawing Sheets

(56) References Cited

U.S. PATENT DOCUMENTS

| | | | |
|---|---|---|---|
| 2013/0025939 A1 | 1/2013 | Heliot et al. | |
| 2013/0116993 A1* | 5/2013 | Maliassov | G01V 9/00 703/2 |
| 2013/0292178 A1 | 11/2013 | Burress et al. | |
| 2014/0208287 A1* | 7/2014 | Zhou | G06F 17/5036 716/136 |
| 2014/0236558 A1* | 8/2014 | Maliassov | G01V 99/00 703/10 |
| 2015/0241596 A1* | 8/2015 | Donderici | G01V 3/28 324/338 |
| 2017/0082770 A1* | 3/2017 | Mandviwala | E21B 47/0905 |
| 2017/0292362 A1* | 10/2017 | Aniket | E21B 44/00 |
| 2018/0202283 A1* | 7/2018 | Jaaskelainen | E21B 47/06 |
| 2018/0230785 A1* | 8/2018 | Mogou Dessap | E21B 41/00 |

\* cited by examiner

*FIG. 1*

| Run | Task # | Task | Task Duration (hrs) | Elapsed Time (hrs) | Measured Depth (ft) | Cable Speed (fpm) | Capstan 0/1 = off/on | Production Rate (bpd) | WHP (psi) | Surface Weight (lb) |
|---|---|---|---|---|---|---|---|---|---|---|
| 1 | 1 | Start | 0.00 | 0.00 | 0 | 0 | 0 | 0 | 5000 | 0 |
| 1 | 2 | Rig up | 1.50 | 1.50 | 0 | 0 | 0 | 0 | 5000 | 0 |
| 1 | 3 | Start RIH | 0.00 | 1.50 | 0 | 0 | 0 | 0 | 5000 | 4000 |
| 1 | 4 | RIH to SSV | 0.50 | 2.00 | 3000 | 100 | 0 | 0 | 5000 | 5500 |
| 1 | 5 | RIH to CSG | 1.00 | 3.00 | 21000 | 300 | 0 | 0 | 5000 | 10500 |
| 1 | 6 | Tool checks | 0.50 | 3.50 | 21000 | 0 | 1 | 0 | 5000 | 10500 |
| 1 | 7 | Log DN to TD | 1.00 | 4.50 | 24000 | 50 | 1 | 5000 | 1500 | 12000 |
| 1 | 8 | Log UP – Repeat | 0.10 | 4.60 | 23880 | 20 | 1 | 5000 | 1500 | 16000 |
| 1 | 9 | RIH to TD | 0.10 | 4.70 | 24000 | 20 | 1 | 5000 | 1500 | 12000 |
| 1 | 10 | Start Main Pass | 0.00 | 4.70 | 24000 | 0 | 1 | 5000 | 1500 | 16000 |
| 1 | 11 | End of Main Pass | 2.50 | 7.20 | 21000 | 20 | 1 | 5000 | 1500 | 12500 |
| 1 | 12 | Tool verifications | 0.50 | 7.70 | 21000 | 0 | 1 | 0 | 5000 | 12500 |
| 1 | 13 | POOH to SSV | 1.00 | 8.70 | 3000 | 300 | 0 | 0 | 5000 | 6500 |
| 1 | 14 | POOH to surface | 0.50 | 9.20 | 0 | 100 | 0 | 0 | 5000 | 4000 |
| 1 | 15 | Rig Dn string 1 | 0.50 | 9.70 | 0 | 0 | 0 | 0 | 5000 | 0 |

*FIG. 2A*

| Run | Task # | Task | Task Duration (hrs) | Elapsed Time (hrs) | Measured Depth (ft) | Cable Speed (fpm) | Capstan 0/1 = off/on | Production Rate (bpd) | WHP (psi) | Surface Weight (lb) |
|---|---|---|---|---|---|---|---|---|---|---|
| 2 | 16 | Rig Up string 2 | 0.50 | 10.20 | 0 | 0 | 0 | 0 | 5000 | 0 |
| 2 | 17 | Start RIH | 0.00 | 10.20 | 0 | 0 | 0 | 0 | 5000 | 5000 |
| 2 | 18 | RIH to SSV | 0.50 | 10.70 | 3000 | 100 | 0 | 0 | 5000 | 6000 |
| 2 | 19 | RIH to CSG | 1.00 | 11.70 | 21000 | 300 | 0 | 0 | 5000 | 11500 |
| 2 | 20 | Tool checks | 0.50 | 12.20 | 21000 | 0 | 1 | 0 | 5000 | 11500 |
| 2 | 22 | Log UP - Repeat | 0.07 | 12.27 | 20800 | 50 | 1 | 3000 | 2000 | 15000 |
| 2 | 23 | RIH to TD | 0.07 | 12.33 | 21000 | 50 | 1 | 3000 | 2000 | 13000 |
| 1 | 24 | Start Main Pass | 0.00 | 12.33 | 21000 | 0 | 1 | 3000 | 2000 | 15000 |
| 2 | 25 | End of Main Pass | 2.67 | 15.00 | 5000 | 100 | 1 | 3000 | 2000 | 7500 |
| 2 | 26 | Tool verifications | 0.50 | 15.50 | 5000 | 0 | 1 | 0 | 5000 | 7500 |
| 2 | 27 | POOH to SSV | 0.11 | 15.61 | 3000 | 300 | 0 | 0 | 5000 | 6000 |
| 2 | 28 | POOH to surface | 0.83 | 16.44 | 0 | 100 | 0 | 0 | 5000 | 4000 |
| 2 | 29 | Rig Dn string 2 | 0.50 | 16.94 | 0 | 0 | 0 | 0 | 5000 | 0 |

GENERATING A SCRIPT FOR PERFORMING A WELL OPERATION JOB

BACKGROUND

The present disclosure relates generally to well operations and, more particularly, to generating a script for performing a well operation job.

As it became more difficult to discover large oil and gas fields in relatively shallow and friendly environments, exploration of more complex and less familiar territories has necessitated the creation of new technologies and methods designed to drill, complete, and produce longer, deeper, and more deviated wells.

The use of traditional conveyance methods in these types of complex wells typically require longer deployment times than those in more conventional wells. Unassisted wireline logging approaches are ineffective due to borehole deviation and geometry anomalies that could prevent the logging tools from reaching total depth, thereby failing to acquire logging data in critical intervals. Additionally the high amount of rig time required by several wireline runs, and the chance of the logging toolstrings becoming stuck resulting in costly fishing jobs, are also problematic. Drillpipe is one approach used in these types of wells because of its reliability in reaching total depth and its effectiveness in avoiding fishing jobs. However, it is a very cost and time expensive approach.

Thus, it became pertinent to develop new conveyance and risk-reduction technologies which would help bring down costs and risks involved in logging such complex well conditions.

BRIEF SUMMARY

According to examples of the present disclosure, techniques including methods, systems, and/or computer program products for deployment risk management are provided. An example computer-implemented method may include: receiving, by a processing device, operating parameters for simulating a well operation job; simulating, by the processing device, the well operation job based on the operating parameters to generate a script for performing the well operation job, wherein the script comprises an ordered plurality of tasks and corresponding task parameters; and performing the well operation job based on the script generated by the simulation.

Additional features and advantages are realized through the techniques of the present disclosure. Other aspects are described in detail herein and are considered a part of the disclosure. For a better understanding of the present disclosure with the advantages and the features, refer to the following description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages thereof, are apparent from the following detailed description taken in conjunction with the accompanying drawings in which:

DETAILED DESCRIPTION

Well interventions and wireline logging operations can be performed using several different conveyance approaches, including drill pipe, tubing, coiled tubing, wireline, slickline, etc. However, most of these intervention or logging operations require several runs in in the borehole.

Simulations may be used in place of performing traditional intervention or logging operations. In particular, force simulations may be performed using Newtonian physics to analyze operational data that defines what happens during "run in hole" (RIH) and "pull out of hole" (POOH) operations on a cable at different depths in the borehole. The cable is used to lower and raise a logging tool in the borehole. The simulation attempts to reduce the amount of excess cable during RIH and to prevent excess forces on the cable during POOH.

These simulations must account for various environmental factors that vary with well depth, such as borehole trajectory, borehole geometry, borehole temperature and pressure, well fluid rheology and physical properties, friction, etc. Moreover, these simulations must account for operational factors that can be controlled by a user based on well depth such as running speed, flowing direction and rates, well head pressures, extending arms, inflating packers, varying flow clearance, dropping/collecting material, etc.

Many current simulation approaches only consider systems in equilibrium (i.e., no transient events, at a constant speed, no accelerating forces). There are referred to as steady state simulations. Accordingly, these current simulation approaches fail to adequately determine deployment risk management.

The present techniques for deployment risk management use a script-based data entry and modeling approach to perform a variety of performance and risk analyses not currently possible with depth-based simulation programs, such as operating time forecasts, heat generation/transfer, and tool temperate profiles. Moreover, the script-based approach described herein provides for the effective enforcement of operating policies by using pre-defined scripts for critical tasks/operations (i.e., stuck tool, POOH near surface, etc.).

Example embodiments of the disclosure include or yield various technical features, technical effects, and/or improvements to technology. Example embodiments of the disclosure provide for generating a script for performing a well operation job for deployment risk management. The script-based approach described herein provides for the effective enforcement of operating policies by using pre-defined scripts for critical tasks/operations (i.e., stuck tool, POOH near surface, etc.). These aspects of the disclosure constitute technical features that yield the technical effect of reducing risk to the well operation and the equipment used in the well operation by performing the well operation using a generated script.

As a result of these technical features and technical effects, generating a script for performing a well operation job in accordance with example embodiments of the disclosure represents an improvement to existing deployment risk management simulation techniques. It should be appreciated that the above examples of technical features, technical effects, and improvements to technology of example embodiments of the disclosure are merely illustrative and not exhaustive.

Additional advantages of the techniques provided herein may include: modeling of a complete job (all runs) deployment; creating an "all runs" deployment risk analysis report; forecasting tasks and overall operating time; modeling/analyzing of unaccounted operations (e.g., rig up/down, repeat logs, checks/verifications, etc.); modeling heat transfer and tools temperatures; assessing compression and decompression rates; analyzing spooling profile changes and risk during the entire job; populating operational parameters in the script using stand-alone analysis; modeling of contingency operations (i.e., stuck tool, fishing operations, etc.); automatically enforcing operating policies by defining scripts for specific operations (i.e., stuck tool); simplifying interdependent operational choices (i.e., wellhole pressure, production rate); directly translating customer job plans into detailed wireline deployment plans; and/or enhancing the "what-if" type of analysis for the entire sequence of operations (i.e., selection of optimum cable type).

Figure 1:
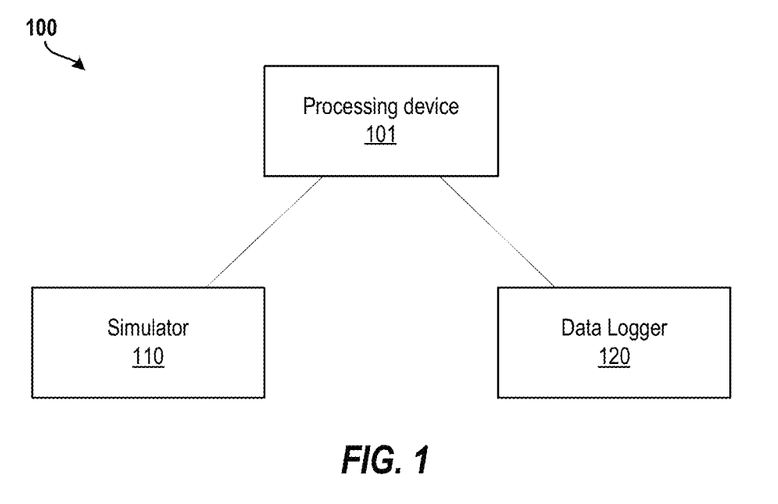
FIG. 1 illustrates a block diagram of a processing system generating a script for performing a well operation job according to aspects of the present disclosure.

FIG. 1 illustrates a block diagram of a processing system for generating a script for performing a well operation job according to examples of the present disclosure. The various components, modules, engines, etc. described regarding FIG. 1 may be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein may be a combination of hardware and programming. The programming may be processor executable instructions stored on a tangible memory, and the hardware may include processing device 101 for executing those instructions. Thus a system memory can store program instructions that when executed by processing device 101 implement the engines described herein. Other engines may also be utilized to include other features and functionality described in other examples herein.

The processing system 100 may include processing device 101, a simulator 110, and a data logger 120. Alternatively or additionally, the processing system 100 may include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein. The processing system 100 uses a script-based approach to provides for the effective enforcement of operating policies by using pre-defined scripts for critical tasks/operations (i.e., stuck tool, POOH near surface, etc.).

The simulator 110 of the processing system 100 receives operating parameters for simulating a well operation job. The simulator 110 then simulates the well operation job based on the operating parameters to generate a script for performing the well operation job, wherein the script comprises an ordered plurality of tasks and corresponding task parameters. The script is then used to perform the well operation job at a jobsite. The data logger 120 logs data about the well operation job while the well operation job is performed based on the script generated by the simulation.

Figure 2A:
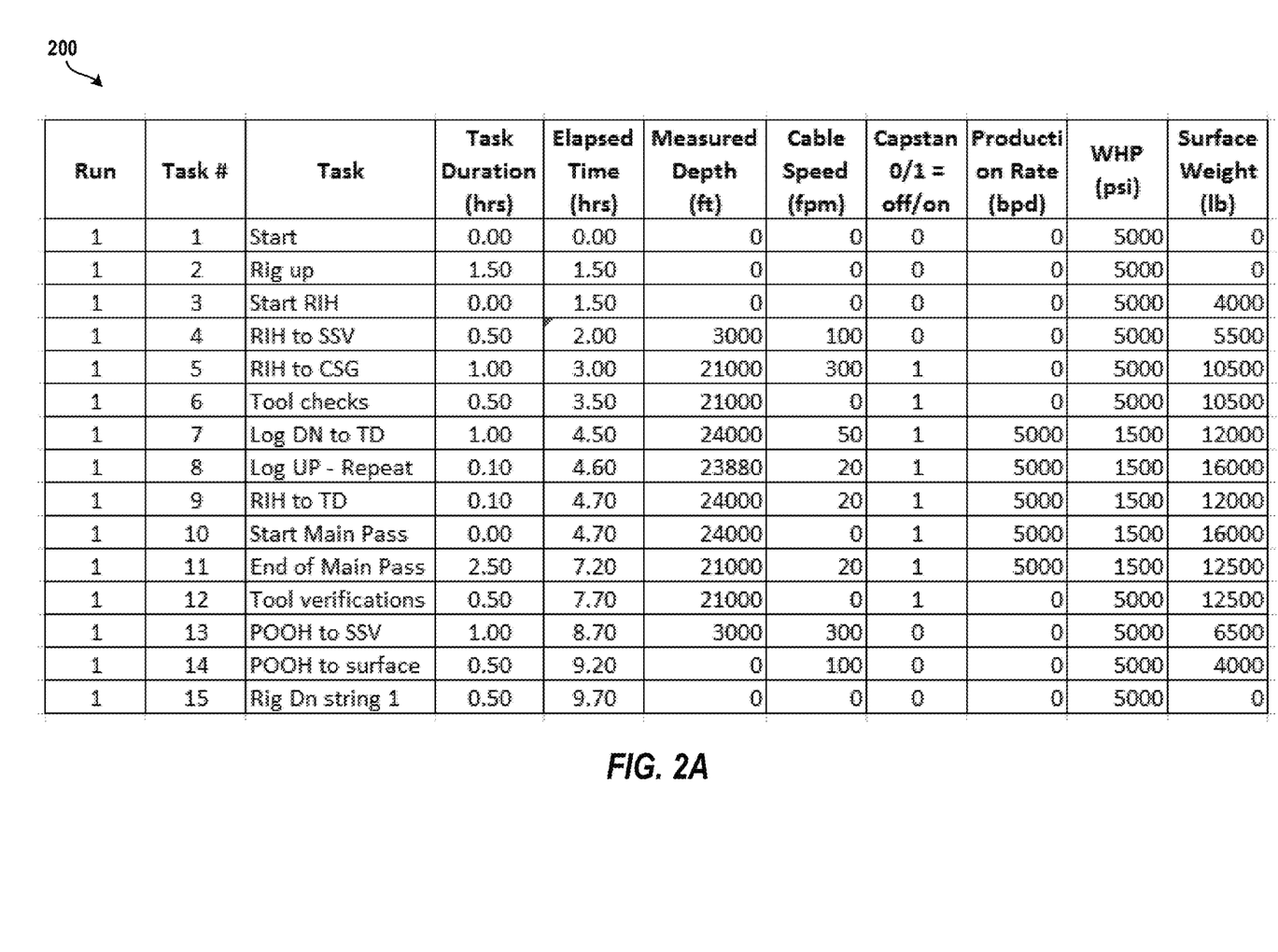
FIGS. 2A and 2B illustrate a table of a script generated from a simulation for performing a well operation job according to aspects of the present disclosure.
Figure 2B:
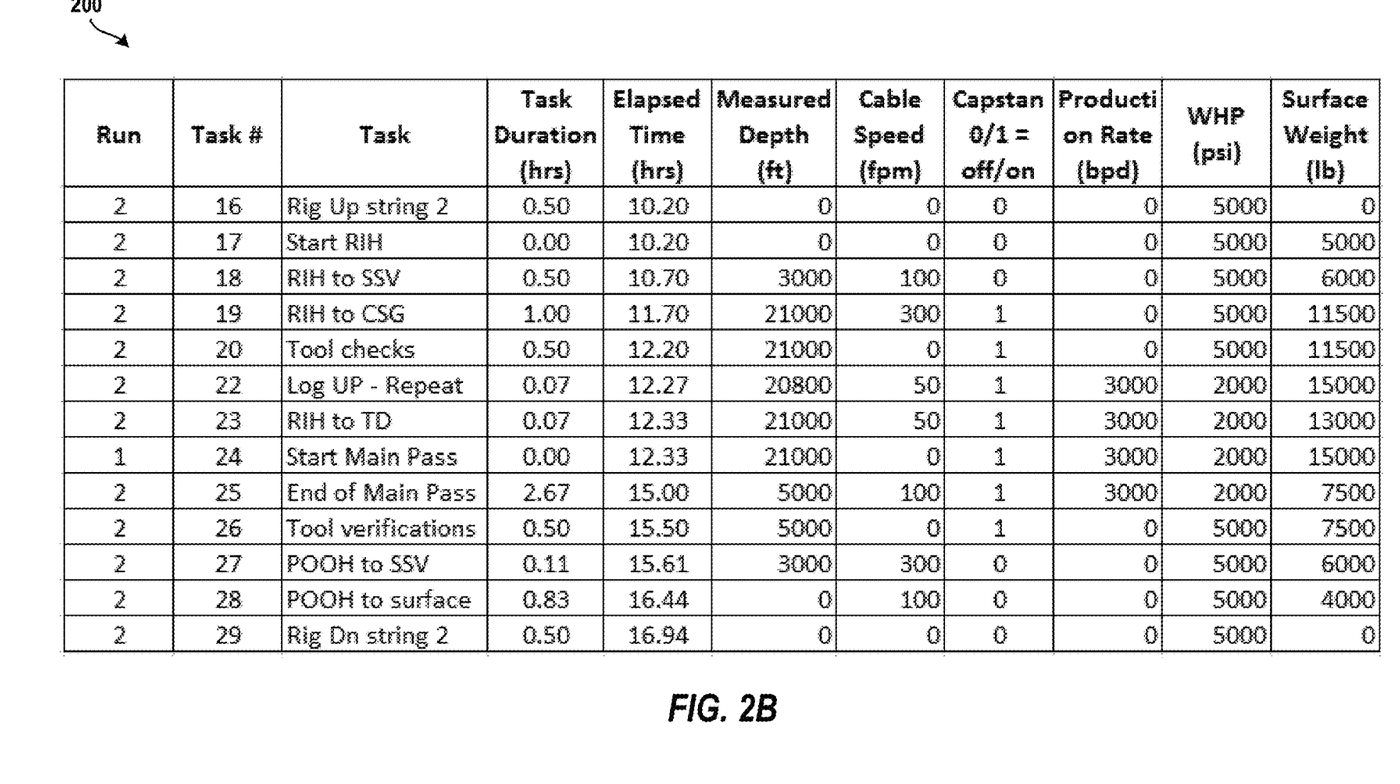

It should be appreciated that additional aspects and details of the processing system 100 are described below. For example, FIGS. 2A and 2B illustrate a table of a script 200 generated from a simulation for performing a well operation job according to aspects of the present disclosure. The script 200 of FIG. 2A relates to a first run having tasks numbered 1-15, and the script 200 of FIG. 2B relates to a second run having tasks numbered 16-29. The script 200 is recorded in a time-based data entry matrix instead of a traditional depth-based approach. In this way, each task part of a multi-run operation is defined in terms of the environmental and operational factors and can be presented in a time-based or a depth-based graph.

Referring to the example script 200, each task may have various task properties associated therewith. For example, a task property may include a task number, task description, task duration (in hours), elapsed time (in hours), measured depth (in feet), a cable speed (in feet per minute), a capstan status (on or off), a production rate (in barrels per day), a wellhole pressure (in pounds per square inch), and a surface weight (in pounds) associated therewith. Examples of tasks may include a start task, a rig up task, a start run in hole task, a run in hole to safety valve task, a run in hole to end of casing hole task, a tool check task, a logging down to total depth (end of hole) task, a logging up task, an additional run in hole to total depth task, a start main logging pass task, an end main logging pass task, a tool verification task, a pull out of hole to safety valve task, a pull out of hole to surface task, and a rig down task.

Each of the tasks, indicated by a task number, may have different parameters, such as measured depth and cable speed associated therewith. For example, during some portions of the logging, such as the run in hole to the safety valve task, the cable speed may be 100 feet per minute to a depth of 3000 feet (task #4). Then, once the measured depth hits 3000, the cable speed may increase to 300 feet per minute to a depth of 21000 feet (task #5). By varying the cable speed through different portions of the wellbore, the script 200 reduces the amount of excess cable during RIH and to prevent excess forces on the cable during POOH.

In the example script 200 of FIG. 2A, two logging passes occur: tasks 7 and 8, and tasks 10 and 11. This enables the logged data to be compared and validated. Similarly, two logging passes may occur for run number 2 of the script 200 illustrated in FIG. 2B. For example, task 22 represents one logging pass, and tasks 24 and 25 represent another logging pass.

Figure 3:
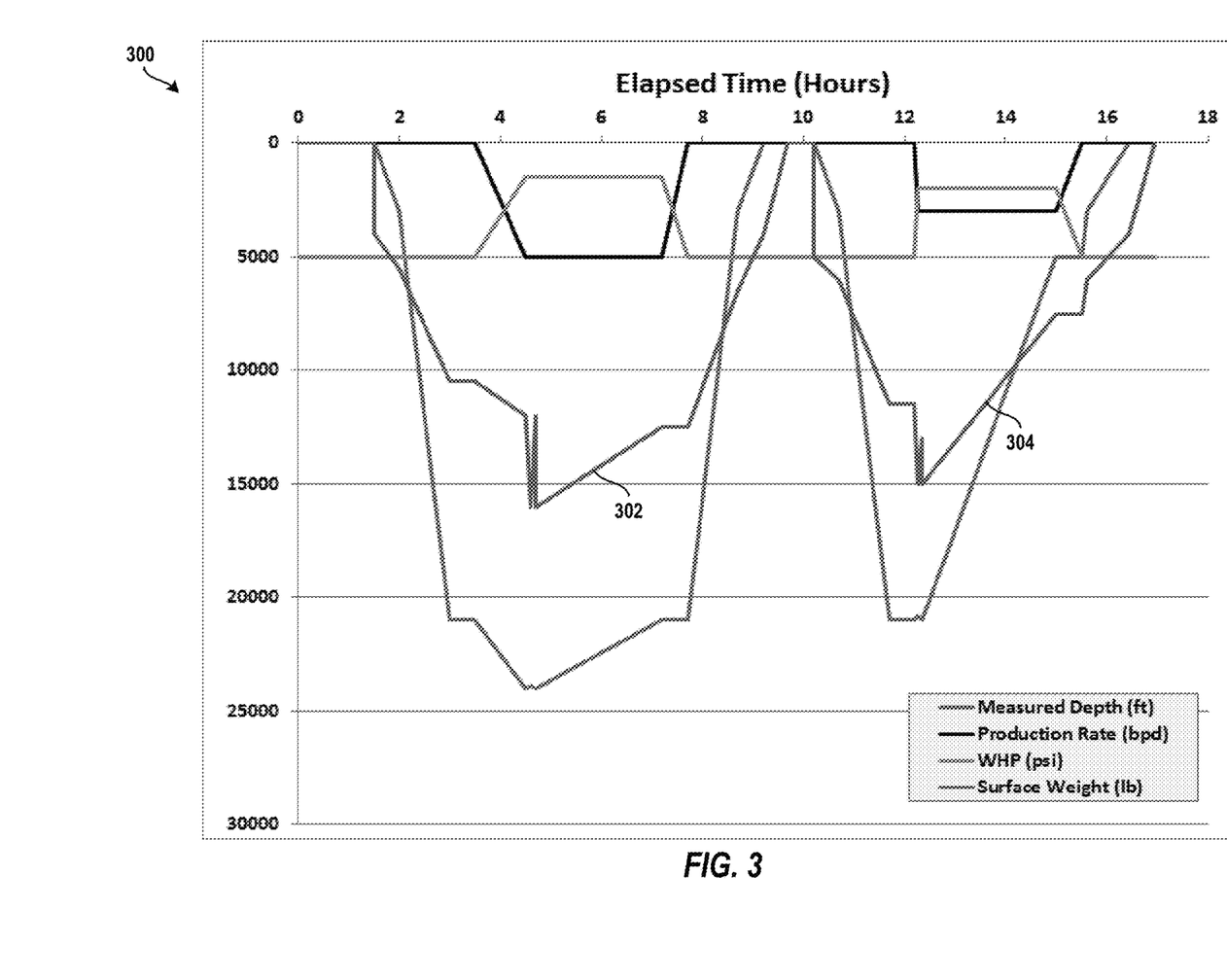
FIG. 3 illustrates a graph of the script of FIGS. 2A and 2B according to aspects of the present disclosure.

The tasks of the script 200 of FIGS. 2A and 2B may be illustrated graphically. For example, FIG. 3 illustrates a graph 300 of the script 200 according to aspects of the present disclosure. Instead of applying traditional depth-based simulation scripts, the graph 300 plots the elapsed time (in hours) along the horizontal axis in comparison to various units along the vertical axis.

It should be appreciated that the units of the vertical axis depend upon the task property being graphed. In the example of FIG. 3, the following task properties are graphed: measured depth (in feet), production rate (in barrels per day), wellhole pressure (in pounds per square inch), and surface weight (in pounds). In the case of surface weight, the vertical axis represents pounds, while in the case of measured depth, the vertical axis represents feet.

The main logging pass (tasks 10 and 11) of job 1 is indicated by the line segment 302, while the main logging pass (tasks 24 and 25) of job 2 is indicated by the line segment 304.

Figure 4:
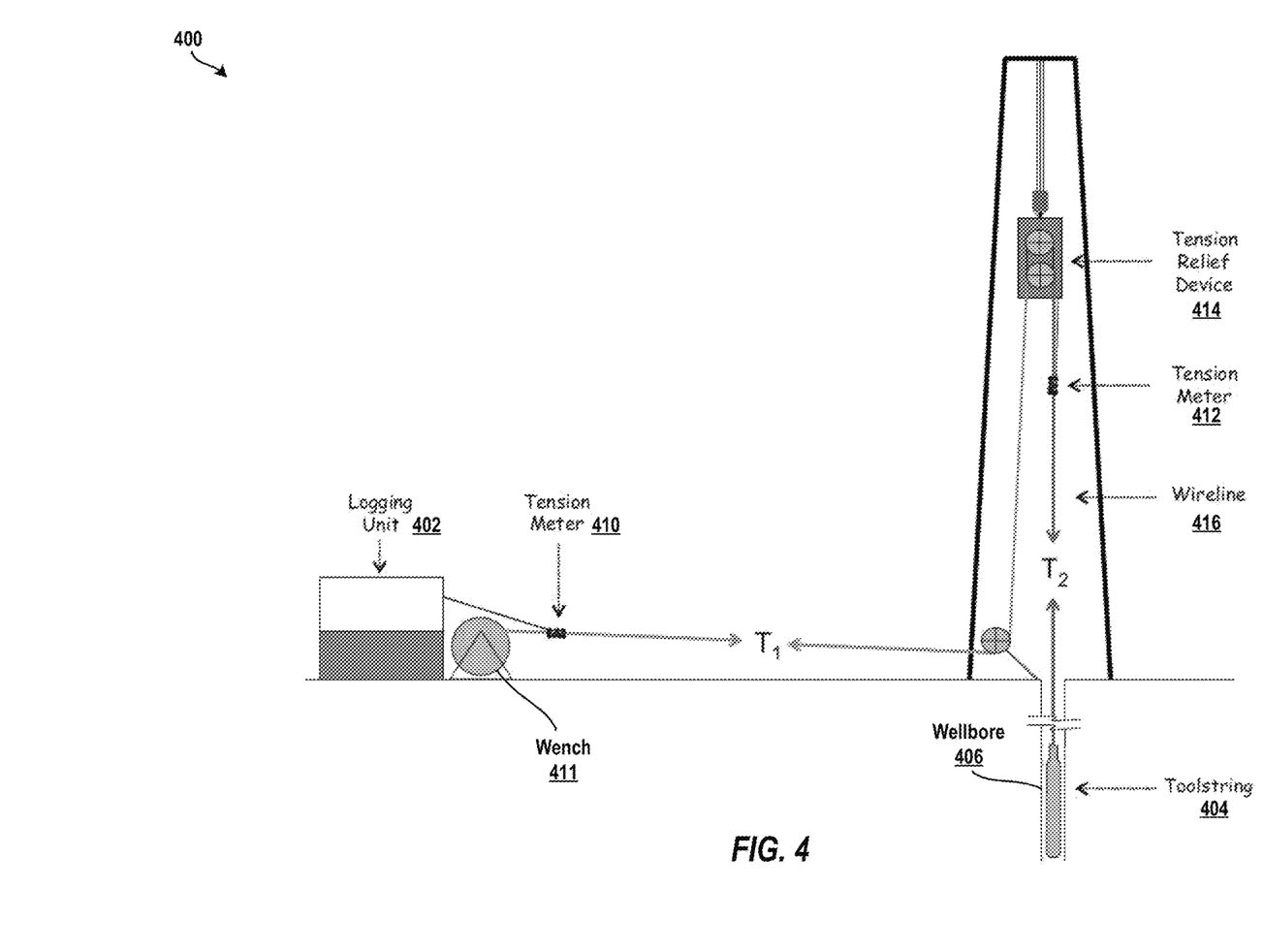
FIG. 4 illustrates a block diagram of a system for performing a well operation job based on a script generated from a simulation according to aspects of the present disclosure.

FIG. 4 illustrates a block diagram of a system 400 for performing a well operation job based on a script generated from a simulation according to aspects of the present disclosure. The system 400 includes a logging unit 402 and a toolstring 404 moveably positioned within a wellbore 406. To perform the well operation job, the toolstring 404 is lowered and raised within the wellbore 406 to log data about the wellbore based on the script (e.g., script 200) generated from a simulation according to aspects of the present disclosure. The logging unit 402 performs the logging and stores the data collected by the toolstring 404.

In some examples, such as illustrated in FIG. 4, the system 400 may additionally include a tensioning relief device with associated tension meters 410, 412, a tension relief device 414, and a cable (e.g., wireline 416). In particular, the tension relief device 414 is maintains a pre-selected constant wireline tension on the winch 411 side, while allowing tensions on the wireline 416 well side to vary over a wide range. In the example, $T_1$ may be a constant low tension while $T_2$ may vary over a range such as 0 lb. to 20,000 lb. (although other suitable ranges are possible). Tension relief devices avoid the safety hazards associated when high tension is exerted on the wireline 416 between the logging unit 402 and rig floor (not shown). These devices also eliminate wireline damage when spooling high tension wireline over low-tension wireline.

Figure 5:
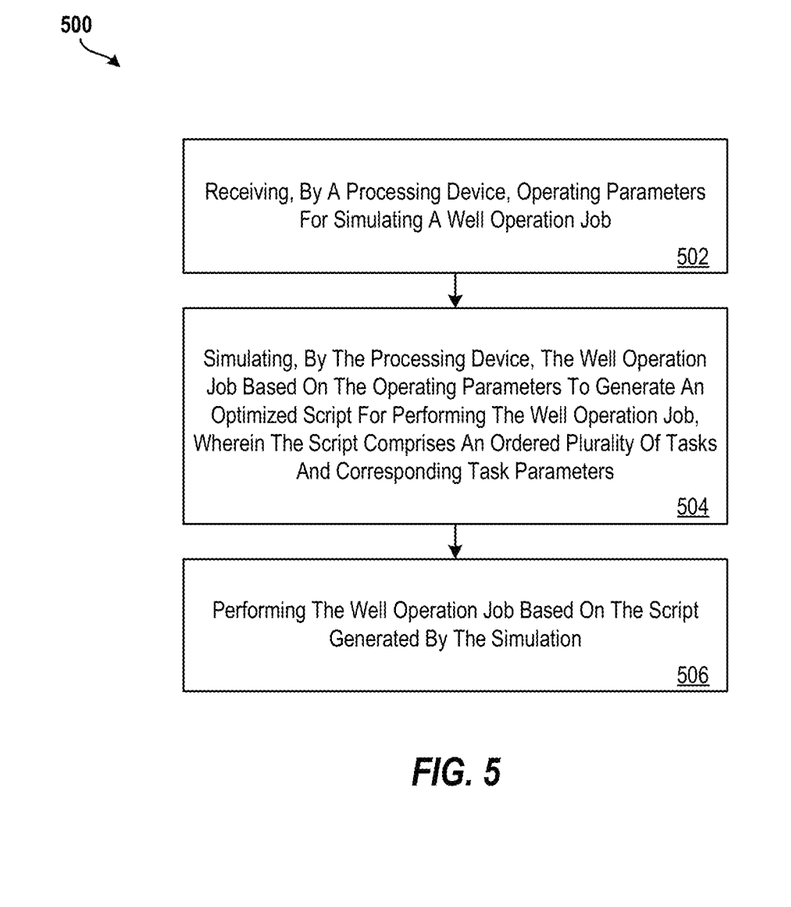
FIG. 5 illustrates a flow diagram of a method for generating am optimized script for performing a well operation job according to aspects of the present disclosure.

FIG. 5 illustrates a flow diagram of a method 500 for generating an optimized script for performing a well operation job according to aspects of the present disclosure. The method 500 may be performed by any suitable processing system, such as the processing system 100 of FIG. 1, the processing system 20 of FIG. 2, or by another suitable processing system.

At block 502, the method 500 includes receiving operating parameters for simulating a well operation job. In examples, the operating parameters include parameters about the logging unit, the cable, the wellbore, and other aspects of the well operation. For example, the operating parameters may include a logging tool parameter, a drilling fluid type parameter, a cable type, a cable load rating, etc. In some examples, receiving the operating parameters also includes receiving well parameters such as a well total depth, a wellbore geometry, etc.

At block 504, the method 500 includes simulating the well operation job based on the operating parameters to generate a script for performing the well operation job. The script comprises an ordered plurality of tasks and corresponding task parameters. According to aspects of the present disclosure, simulating the well operation job includes performing a plurality of analyses on the operating parameters.

In examples, the corresponding task parameters include one or more of the following: a task duration, an elapsed time parameter, a measured depth parameter, a cable speed parameter, a capstan state parameter, a production rate parameter, a wellhole pressure parameter, and a surface weight parameter. The ordered plurality of tasks can be identified by a task number.

The ability to simulate the intended operation using different combinations of task parameters allows an analyst to optimize the job script to meet defined objectives, such as minimizing the total operating time, limiting the maximum tension on the cable, maximizing the amount of additional pull when trying to free a stuck tool, ensuring a minimum tension on the cable, avoiding overheating the downhole tools, minimizing the mechanical stress on the downhole tool housings, reducing the pressure swab and surge effects and any other outcome resulting from the execution of the operation planned.

In examples, simulating the well operation job enables an analyst to simulate the well operation job using different combinations of corresponding task parameters to optimize the job script to meet defined objectives. Examples of defined objections may include minimizing a total operating time, limiting a maximum tension on the cable, maximizing an amount of additional pull when trying to free a stuck tool, ensuring a minimum tension on the cable, avoiding overheating the downhole tools, minimizing the mechanical stress on the downhole tool housings, reducing the pressure swab and surge effects, and any other outcome resulting from the execution of the operation planned.

At block 506, the method 500 includes performing the well operation job based on the script generated by the simulation. The well operation job may be performed, for example, by the system 400 of FIG. 4 or by another suitable system for performing the well operation job. The well operation job can be a logging job for logging data in a wellbore or another suitable job. In some examples, the well operation job is performed according to an order of the ordered plurality of tasks. For example, a first ordered task is performed first, a second ordered task is performed second, and so forth. In this way, the well operation job is performed according to the ordered tasks of the script.

Additional processes also may be included. For example, the method 500 may include generating a report. The report may include simulated values for the operating parameters, such as (operating time, maximum borehole temperature, maximum hydrostatic pressure, maximum tension on the cable, amount of additional pull available when trying to free a stuck tool, minimum tension on the cable, maximum downhole tools temperature, maximum mechanical stress on the downhole tool housings, maximum production rate acceptable, pressure swab and surge effects and any other outcome resulting from the execution of the operation planned). The report may also include statements corresponding to the values that describe how well each value of the operating parameters complies with a set of pre-defined target ranges for each of the operating parameters. It should be understood that the processes depicted in FIG. 5 represent illustrations, and that other processes may be added or existing processes may be removed, modified, or rearranged without departing from the scope and spirit of the present disclosure.

Figure 6:
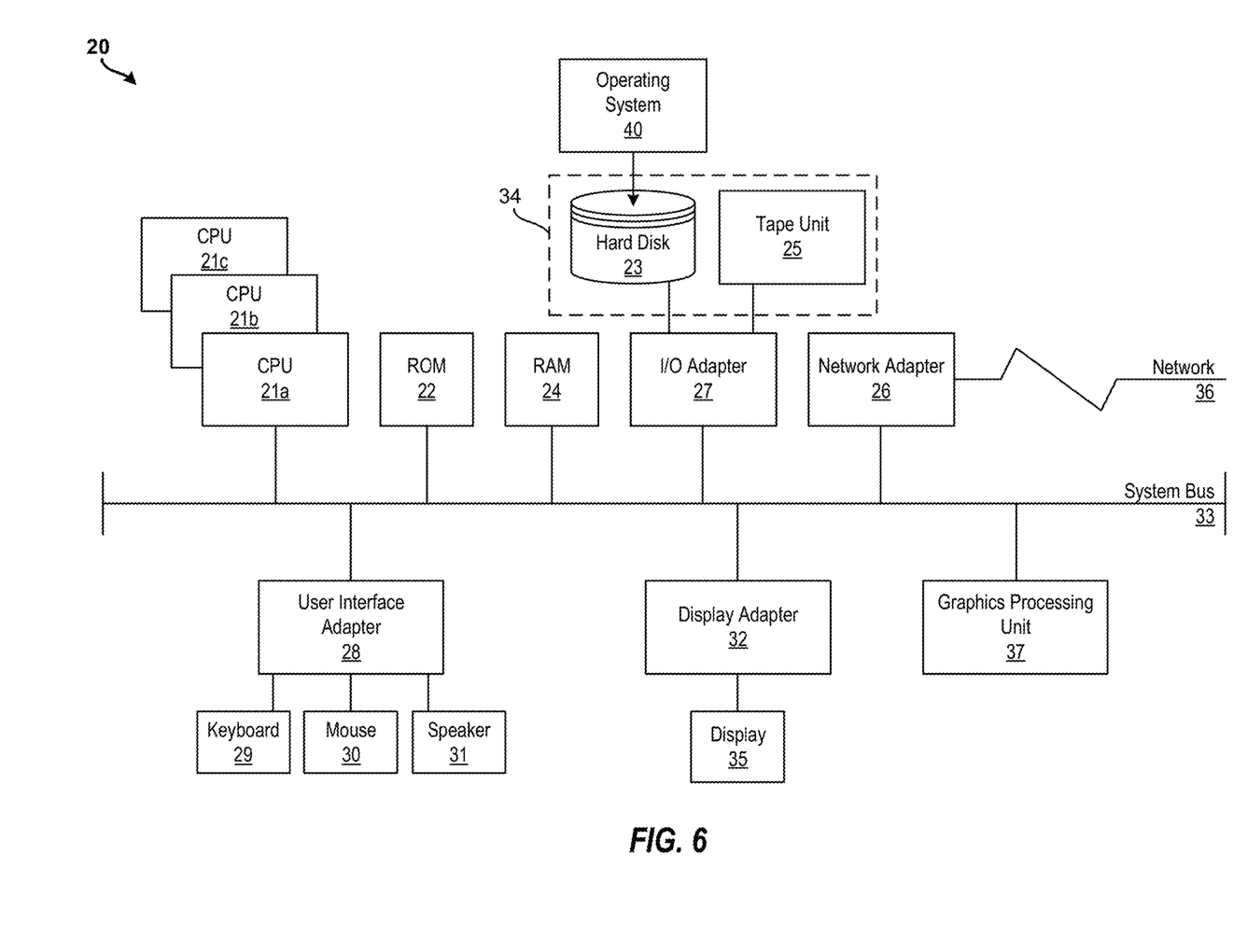
FIG. 6 illustrates a block diagram of a processing system for implementing the techniques described herein according to aspects of the present disclosure.

It is understood in advance that the present disclosure is capable of being implemented in conjunction with any other type of computing environment now known or later developed. For example, FIG. 6 illustrates a block diagram of a processing system 20 for implementing the techniques described herein. In examples, processing system 20 has one or more central processing units (processors) 21a, 21b, 21c, etc. (collectively or generically referred to as processor(s) 21 and/or as processing device(s)). In aspects of the present disclosure, each processor 21 may include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and may include a basic input/output system (BIOS), which controls certain basic functions of processing system 20.

Further illustrated are an input/output (I/O) adapter 27 and a communications adapter 26 coupled to system bus 33. I/O adapter 27 may be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 20 may be stored in mass storage 34. A network adapter 26 interconnects system bus 33 with an outside network 36 enabling processing system 20 to communicate with other such systems.

A display (e.g., a display monitor) 35 is connected to system bus 33 by display adaptor 32, which may include a graphics adapter to improve the performance of graphics intensive applications and a video controller. In one aspect of the present disclosure, adapters 26, 27, and/or 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 may be interconnected to system bus 33 via user interface adapter 28, which may include, for example, a Super I/O chip integrating multiple device adapters into a single integrated circuit.

In some aspects of the present disclosure, processing system 20 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing, and has a highly parallel structure that makes it more effective than general-purpose CPUs for algorithms where processing of large blocks of data is done in parallel.

Thus, as configured herein, processing system 20 includes processing capability in the form of processors 21, storage capability including system memory (e.g., RAM 24), and mass storage 34, input means such as keyboard 29 and mouse 30, and output capability including speaker 31 and display 35. In some aspects of the present disclosure, a portion of system memory (e.g., RAM 24) and mass storage 34 collectively store an operating system such as the AIX® operating system from IBM Corporation to coordinate the functions of the various components shown in processing system 20.

The present techniques may be implemented as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some examples, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to aspects of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various examples of the present disclosure have been presented for purposes of illustration, but are not intended to be exhaustive or limited to the embodiments disclosed. Many modifications and variations will be apparent to those of ordinary skill in the art without departing from the scope and spirit of the described techniques. The terminology used herein was chosen to best explain the principles of the present techniques, the practical application or technical improvement over technologies found in the marketplace, or to enable others of ordinary skill in the art to understand the techniques disclosed herein.

Set forth below are some embodiments of the foregoing disclosure:

Embodiment 1

A computer-implemented method for deployment risk management, the method comprising: receiving, by a processing device, operating parameters for simulating a well operation job; simulating, by the processing device, the well operation job based on the operating parameters to generate a script for performing the well operation job, wherein the script comprises an ordered plurality of tasks and corresponding task parameters; and performing the well operation job based on the script generated by the simulation.

Embodiment 2

The method of any prior embodiment, wherein the operating parameters comprise a logging tool parameter, a drilling fluid type parameter, a cable type, a cable load rating, a wellbore geometry.

Embodiment 3

The method of any prior embodiment, wherein receiving the operating parameters further comprises receiving well parameters.

Embodiment 4

The method of any prior embodiment, wherein the corresponding task parameters comprise a task duration, an elapsed time parameter, a measured depth parameter, a cable speed parameter, a capstan state parameter, a production rate parameter, a wellhole pressure parameter, and a surface weight parameter.

Embodiment 5

The method of any prior embodiment, wherein the ordered plurality of tasks are identified by a task number.

Embodiment 6

The method of any prior embodiment, wherein simulating the well operation job comprises calculating mechanical and hydraulic forces along the length of tools and a cable used to perform the well operation job and a mechanical stress profile on the tools.

Embodiment 7

The method of any prior embodiment, wherein simulating the well operation job enables an analyst to simulate the well operation job using different combinations of corresponding task parameters to optimize the job script to meet defined objectives.

Embodiment 8

The method of any prior embodiment, further comprising logging data in a wellbore of the well operation while the well operation job is performed.

Embodiment 9

The method of any prior embodiment, wherein performing the well operation job based on the script generated by the simulation further comprises performing the well operation job according to an order of the ordered plurality of tasks.

Embodiment 10

The method of any prior embodiment, further comprising: generating a graphical representation of the script, wherein the graphical representation plots elapsed time along a horizontal axis.

Embodiment 11

The system of any prior embodiment, wherein the computer readable instructions further comprise: generating, by the processing device, a report comprising simulated values of the operating parameters and corresponding statements describing how well each value of the operating parameters complies with a set of pre-defined target ranges for each of the operating parameters.

Embodiment 12

A system for deployment risk management, the system comprising: a memory having computer readable instructions; and a processing device for executing the computer readable instructions, the computer readable instructions comprising: receiving, by the processing device, operating parameters for simulating a well operation job; simulating, by the processing device, the well operation job based on the operating parameters to generate a script for performing the well operation job, wherein the script comprises an ordered plurality of tasks and corresponding task parameters; and logging, by the processing device, data about the well operation job while the well operation job is performed based on the script generated by the simulation.

Embodiment 13

The system of any prior embodiment, wherein the operating parameters comprise a logging tool parameter, a drilling fluid type parameter, a cable type, a cable load rating, a wellbore geometry.

Embodiment 14

The system of any prior embodiment, wherein the corresponding task parameters comprise a task duration, an elapsed time parameter, a measured depth parameter, a cable speed parameter, a capstan state parameter, a production rate parameter, a wellhole pressure parameter, and a surface weight parameter.

Embodiment 15

The system of any prior embodiment, wherein simulating the well operation job comprises performing a Newtonian physics analysis on the operating parameters.

Embodiment 16

The system of any prior embodiment, wherein performing the well operation job based on the script generated by the simulation further comprises performing the well operation job according to an order of the ordered plurality of tasks.

Embodiment 17

The system of any prior embodiment, wherein the computer readable instructions further comprise: generating, by the processing device, a graphical representation of the script, wherein the graphical representation plots elapsed time along a horizontal axis.

Embodiment 18

The system of any prior embodiment, wherein the computer readable instructions further comprise: generating, by the processing device, a report comprising simulated values of the operating parameters and corresponding statements describing how well each value of the operating parameters complies with a set of pre-defined target ranges for each of the operating parameters.

While one or more embodiments have been shown and described, modifications and substitutions may be made thereto without departing from the spirit and scope of the invention. Accordingly, it is to be understood that the present invention has been described by way of illustrations and not limitation.

What is claimed is:

1. A computer-implemented method for deployment risk management, the method comprising:
   receiving, by a processing device, operating parameters for simulating a deployment of a wireline logging tool;
   simulating, by the processing device, the deployment of the wireline logging tool based on the operating parameters to generate a script for deploying the wireline logging tool in a well, wherein the script comprises an ordered plurality of tasks and corresponding task parameters, wherein simulating the deployment of the wireline logging tool comprises calculating mechanical and hydraulic forces along the length of a tool and a cable used to perform wireline logging and a mechanical stress profile on the tool; and
   deploying the wireline logging tool in the well based on the script generated by the simulation.

2. The method of claim 1, wherein the operating parameters comprise a logging tool parameter, a drilling fluid type parameter, a cable type, a cable load rating, a wellbore geometry.

3. The method of claim 1, wherein receiving the operating parameters further comprises receiving well parameters.

4. The method of claim 1, wherein the corresponding task parameters comprise a task duration, an elapsed time parameter, a measured depth parameter, a cable speed parameter, a capstan state parameter, a production rate parameter, a wellhole pressure parameter, and a surface weight parameter.

5. The method of claim 1, wherein the ordered plurality of tasks are identified by a task number.

6. The method of claim 1, wherein simulating the deploying the wireline logging tool in the well enables an analyst to simulate the well operation job using different combinations of corresponding task parameters to optimize the job script to meet defined objectives.

7. The method of claim 1, further comprising acquiring log data in the well while the wireline logging tool is deployed in the well.

8. The method of claim 1, wherein deploying the wireline logging tool in the well based on the script generated by the simulation further comprises deploying the wireline logging tool in the well according to an order of the ordered plurality of tasks.

9. The method of claim 1, further comprising:
   generating a graphical representation of the script, wherein the graphical representation plots elapsed time along a horizontal axis.

10. The system of claim 1, wherein the computer readable instructions further comprise:
    generating, by the processing device, a report comprising simulated values of the operating parameters and corresponding statements describing how well each value of the operating parameters complies with a set of pre-defined target ranges for each of the operating parameters.

11. A computer-implemented method for deployment risk management, the method comprising:

receiving, by a processing device, operating parameters for simulating a well operation job;

simulating, by the processing device, the well operation job based on the operating parameters to generate a script for performing the well operation job, wherein the script comprises an ordered plurality of tasks and corresponding task parameters, wherein simulating the well operation job comprises calculating mechanical and hydraulic forces along the length of a tool and a cable used to perform the well operation job and a mechanical stress profile on the tool; and performing the well operation job based on the script generated by the simulation.

12. A system for deployment risk management, the system comprising:

a memory having computer readable instructions; and a processing device for executing the computer readable instructions, the computer readable instructions comprising:

receiving, by the processing device, operating parameters for simulating a deployment of a wireline logging tool;

simulating, by the processing device, the deployment of the wireline logging tool based on the operating parameters to generate a script for deploying the wireline logging tool in a well, wherein the script comprises an ordered plurality of tasks and corresponding task parameters wherein simulating the deployment of the wireline logging tool comprises calculating mechanical and hydraulic forces along the length of a tool and a cable used to perform wireline logging and a mechanical stress profile on the tool; and acquiring, by the processing device, data about the wireline logging tool in the well while the wireline logging tool is deployed based on the script generated by the simulation.

13. The system of claim 12, wherein the operating parameters comprise a logging tool parameter, a drilling fluid type parameter, a cable type, a cable load rating, a wellbore geometry.

14. The system of claim 12, wherein the corresponding task parameters comprise a task duration, an elapsed time parameter, a measured depth parameter, a cable speed parameter, a capstan state parameter, a production rate parameter, a wellhole pressure parameter, and a surface weight parameter.

15. The system of claim 12, wherein simulating the deployment of the wireline logging tool comprises performing a Newtonian physics analysis on the operating parameters.

16. The system of claim 12, wherein the wireline logging tool is deployed in the well based on the script generated by the simulation according to an order of the ordered plurality of tasks.

17. The system of claim 12, wherein the computer readable instructions further comprise:

generating, by the processing device, a graphical representation of the script, wherein the graphical representation plots elapsed time along a horizontal axis.

18. The system of claim 12, wherein the computer readable instructions further comprise:

generating, by the processing device, a report comprising simulated values of the operating parameters and corresponding statements describing how well each value of the operating parameters complies with a set of pre-defined target ranges for each of the operating parameters.

* * * * *